United States Patent
Hsu

(10) Patent No.: US 8,314,031 B2
(45) Date of Patent: *Nov. 20, 2012

(54) PLANARIZATION PROCESS FOR PRE-DAMASCENE STRUCTURE INCLUDING METAL HARD MASK

(75) Inventor: Chia-Lin Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 117 days.

This patent is subject to a terminal disclaimer.

(21) Appl. No.: 12/726,347

(22) Filed: Mar. 18, 2010

(65) Prior Publication Data

US 2010/0184293 A1    Jul. 22, 2010

Related U.S. Application Data

(63) Continuation of application No. 11/160,262, filed on Jun. 16, 2005, now Pat. No. 7,718,536.

(51) Int. Cl.
*H01L 21/302* (2006.01)
*H01L 21/461* (2006.01)

(52) U.S. Cl. .... 438/693; 438/633; 438/692; 257/E21.23
(58) Field of Classification Search .......... 438/633, 438/692, 693
See application file for complete search history.

(56) References Cited

U.S. PATENT DOCUMENTS

| | | | |
|---|---|---|---|
| 6,350,682 B1 * | 2/2002 | Liao | 438/638 |
| 6,524,962 B2 * | 2/2003 | Chen et al. | 438/694 |
| 7,091,123 B2 * | 8/2006 | Tonegawa et al. | 438/633 |
| 7,718,536 B2 * | 5/2010 | Hsu | 438/693 |
| 2004/0009671 A1 * | 1/2004 | Kaufman et al. | 438/692 |

* cited by examiner

*Primary Examiner* — Alexander Ghyka
(74) *Attorney, Agent, or Firm* — Jianq Chyun IP Office

(57) ABSTRACT

A planarization process for a pre-damascene structure is described, wherein the pre-damascene structure includes a metal hard mask that is disposed on a first material layer with a damascene opening therein and a second material layer that fills the damascene opening and covers the metal hard mask. A first CMP step is conducted using a first slurry to remove the second material layer outside the damascene opening. A second CMP step is conducted using a second slurry to remove the metal hard mask.

10 Claims, 2 Drawing Sheets

PLANARIZATION PROCESS FOR PRE-DAMASCENE STRUCTURE INCLUDING METAL HARD MASK

CROSS-REFERENCE TO RELATED APPLICATION

This application is a continuation application of and claims the priority benefit of patent application Ser. No. 11/160,262 filed on Jun. 16, 2005, now allowed. The entirety of the above patent application is incorporated by reference herein and made a part of this specification.

BACKGROUND OF THE INVENTION

1. Field of the Invention

The present invention relates to a semiconductor process. More particularly, the present invention relates to a planarization process for a pre-damascene structure that includes a metal hard mask.

2. Description of the Related Art

Damascene techniques are frequently used to form interconnect structures. In a conventional damascene process, a dielectric layer is formed and then patterned using a hard mask to form a damascene opening therein, a metal layer is formed filling the damascene opening, the metal layer outside the opening is removed through chemical mechanical polishing (CMP), and then the hard mask is removed. In the related art, the process of removing the metal layer outside the damascene opening through CMP is considered as a planarization process.

However, as the linewidth of semiconductor devices becomes smaller, the conventional SiO or SiN hard mask is no longer satisfactory for the requirements in critical dimension (CD). Therefore, metal hard masks are reported to use in advanced semiconductor processes. In the prior art, a metal hard mask is removed through dry- or wet-etching after the metal layer filling the damascene opening is planarized through CMP.

SUMMARY OF THE INVENTION

Accordingly, this invention provides a planarization process for a pre-damascene structure including a metal hard mask, which removes the metal hard mask also through CMP.

In a planarization process of this invention, the pre-damascene structure includes a metal hard mask that is disposed on a first material layer with a damascene opening therein and a second material layer that fills the damascene opening and covers the metal hard mask. A first CMP step is conducted using a first slurry to remove the second material layer outside the damascene opening, and then a second CMP step is conducted using a second slurry to remove the metal hard mask.

According to a preferred embodiment of this invention, the first material layer and the second material layer may include a dielectric layer and a metal layer, respectively, for forming an interconnect damascene structure. In such cases, a barrier layer is preferably formed in the damascene opening and on the metal hard mask before the metal layer as the second material layer is formed, while the barrier layer on the metal hard mask is removed in the second CMP step prior to the metal hard mask.

Moreover, the above damascene opening may be, for example, a dual damascene opening that includes a trench and a via hole contiguous with the trench.

According to another embodiment of this invention, the pre-damascene structure may include a dielectric layer as a first material layer, a metal layer as a second material layer and a barrier layer in the damascene opening and on the metal hard mask, while the planarization process may include three CMP steps. The first CMP step is conducted using a first slurry to remove the metal layer outside the damascene opening. The second CMP step is conducted using a second slurry to sequentially remove the barrier layer on the metal hard mask and the metal hard mask. The third CMP step is then conducted using a third slurry to remove a portion of the dielectric layer.

It is to be understood that both the foregoing general description and the following detailed description are exemplary, and are intended to provide further explanation of the invention as claimed.

DESCRIPTION OF THE PREFERRED EMBODIMENTS

First Embodiment

Figure 1:
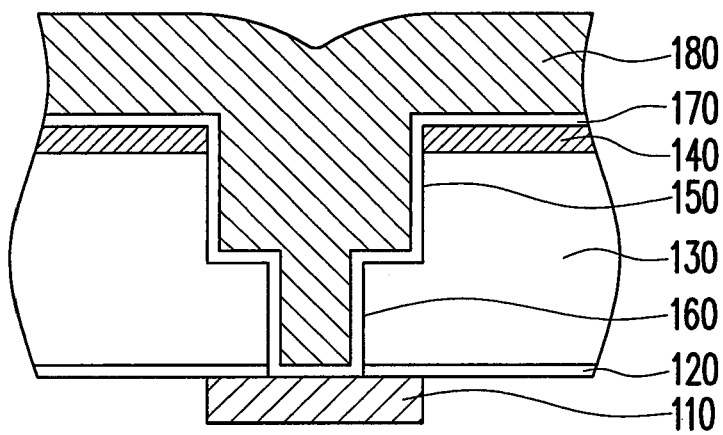
FIGS. 1-3 illustrate a process flow of a planarization process according to a first embodiment of this invention.

Referring to FIG. 1, a substrate 100 having a prior conductive layer 110, a cap layer 120 and a pre-dual damascene structure thereon is provided, wherein the pre-dual damascene structure will be processed into a dual damascene structure that electrically connects with the conductive layer 110. The pre-dual damascene structure includes a dielectric layer 130 having a trench 150 and a via hole 160 contiguous with the trench 150 therein, a metal hard mask 140 on the dielectric layer 130, and a metal layer 180 filling the trench 150 and the via hole 160 and covering the metal hard mask 140.

In addition, a barrier layer 170 is preferably formed on the inner surfaces of the trench 150 and the via hole 160 and on the metal hard mask 140 before the metal layer 180 is formed, so as to prevent diffusion of metal atoms from the metal layer 180. The bottom of the metal layer 180 in the via hole 160 is separated from the conductive layer 110 by the barrier layer 170. The material of the cap layer 120 may be silicon nitride (SiN), SiC, SiCN, SiCO or SiCNO, etc., and the dielectric layer 130 may include TEOS-oxide, thermal oxide or low-k material, etc. The material of the metal hard mask 140 may be Ti, Ta, W, TiN, TaN or WN, for example, wherein the metal nitrides are preferable. The barrier layer 170 may include Ta or Ta/TaN, for example, and the metal layer 180 is possibly a copper layer.

Figure 2:
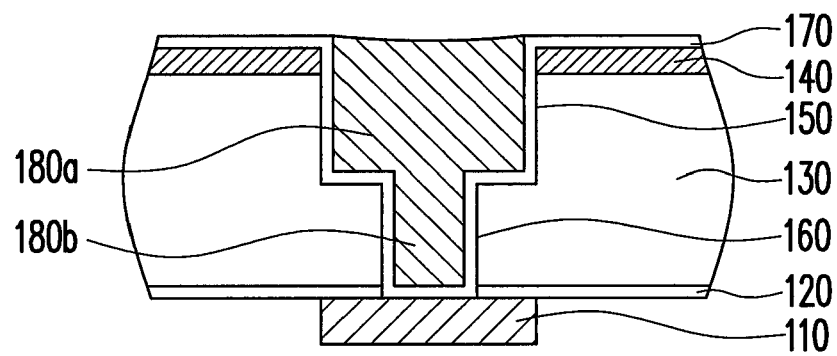

Referring to FIG. 2, a first CMP step is conducted using a first slurry to remove the metal layer 180 outside the trench 150, so that a conductive line 180a and a contact plug 180b are formed in the trench 150 and the via hole 160, respectively. The selectivity of the first slurry to the metal layer 180 relative to the barrier layer 170 preferably ranges from 50:1 to 500:1. When the metal layer 180 includes copper, such a slurry may include $SiO_2$ or $Al_2O_3$, $H_2O_2$ and water and have a pH value of 1-6. In addition, the first CMP step can be conducted on one platen, or on two separated platens in the same CMP machine to increase the throughput, as known in the art.

Figure 3:
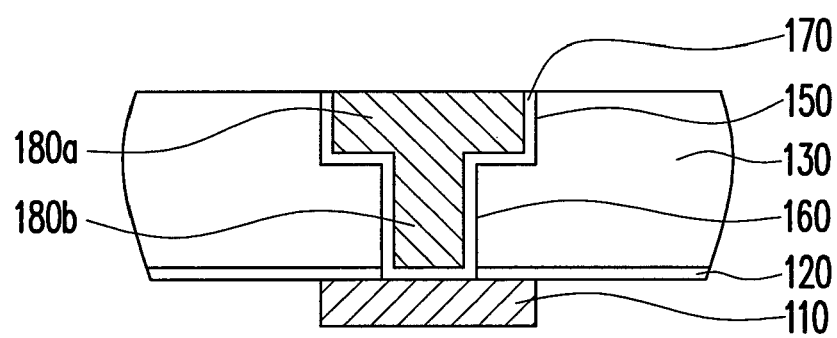

Referring to FIG. 3, a second CMP step is conducted using a second slurry to sequentially remove the barrier layer 170 on the metal hard mask 140 and the metal hard mask 140. The second CMP step can be further conducted to remove a portion of the dielectric layer 130. In such a case, the selectivity of the second slurry to the barrier layer 170 relative to the metal layer 180 preferably ranges from 1:1 to 5:1, the selectivity of the second slurry to the barrier layer 170 relative to the metal hard mask 140 preferably ranges from 1:5 to 5:1, and the selectivity of the second slurry to the barrier layer 170 relative to the dielectric layer 130 preferably ranges from 0.5:1 to 50:1. When the metal layer 180 includes copper, such a second slurry may include $SiO_2$, $H_2O_2$, benzotriazole (BTA) and water as well as have a pH value of 9-13, wherein BTA serves as a copper corrosion inhibitor. The second CMP step may also be conducted on one platen, or on two separated platens in the same CMP machine to increase the throughput, as mentioned above.

Second Embodiment

Figure 4:
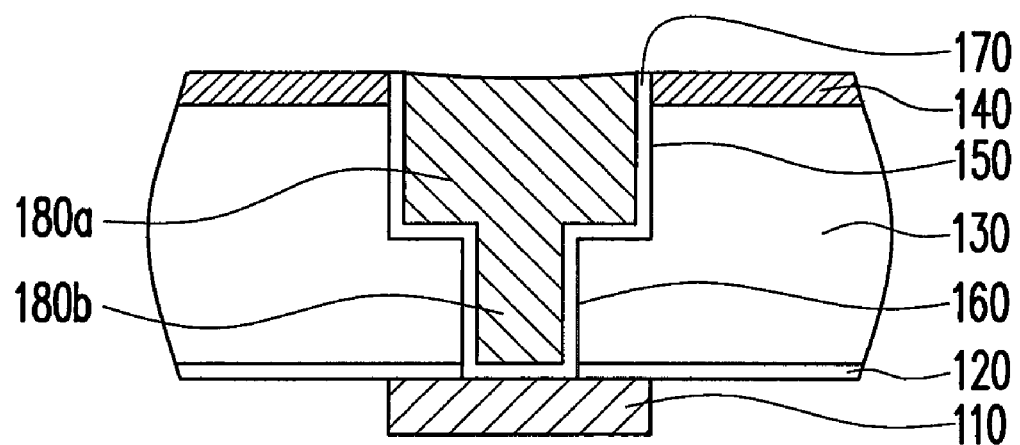
FIGS. 4 and 5 illustrate different stages in the second CMP step of a planarization process according to a second embodiment of this invention, while FIGS. 1, 2, 4+5 and 3 in sequence illustrate the whole planarization process of the second embodiment.

FIGS. 1, 2, 4+5 and 3 in sequence illustrate the whole planarization process according to the second embodiment of this invention.

In the second embodiment, the substrate 100 having a pre-damascene structure as shown in FIG. 1 thereon is provided. A first CMP step is conducted to remove the copper layer 180 outside the damascene opening (150+160), as shown in FIG. 2. The slurry and polishing conditions adopted in the first CMP step can be the same as those mentioned in the above first embodiment.

Figure 5:
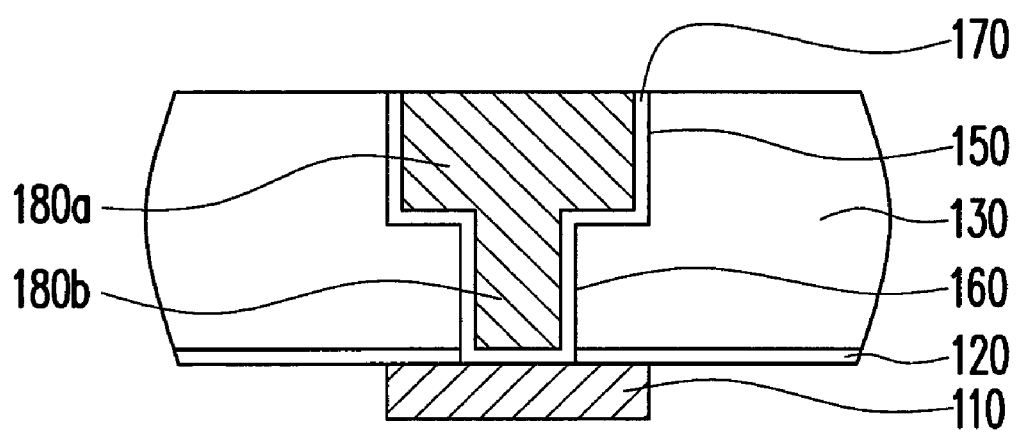

Referring to FIGS. 4-5, a second CMP step is conducted using a second slurry to remove the barrier layer 170 on the metal hard mask 140 (FIG. 4) and then remove the metal hard mask 140 (FIG. 5). In the second CMP step, the selectivity of the second slurry to the barrier layer 170 relative to the metal layer 180 preferably ranges from 1:1 to 5:1, the selectivity of the second slurry to the barrier layer 170 relative to the metal hard mask 140 preferably ranges from 1:5 to 5:1, and the selectivity of the second slurry to the barrier layer 170 or the metal hard mask 140 relative to the dielectric layer 130 ranges from 3:1 to 50:1. When the metal layer 180 includes copper, such a second slurry may include $SiO_2$, $H_2O_2$, benzotriazole (BTA) and water as well as have a pH value of 4-6, wherein the amount of $SiO_2$ is no more than 10 wt % for inhibiting the polishing selectivity to the dielectric layer 130, and BTA serves as a copper corrosion inhibitor. In addition, the second CMP step may also be conducted on one platen, or on two separated platens in the same CMP machine to increase the throughput, as mentioned above.

Referring to FIG. 3, a third CMP step is conducted using a third slurry to remove a portion of the dielectric layer 130, so as to ensure that no residue of the metal hard mask 140 remains to short different conductive lines/contact plugs 180a/b. When the metal layer includes copper, the third slurry suitable for TEOS-oxide, thermal oxide or low-k material, etc., may include $SiO_2$, $H_2O_2$, benzotriazole (BTA) and water as well as have a pH value of 9-13. The third CMP step may also be conducted on one platen, or on two separated platens in the same CMP machine to increase the throughput, as mentioned above.

As described above, by applying the planarization process of this invention, the metal layer filling the damascene opening as well as the metal hard mask can be removed sequentially through CMP.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A planarization process for a pre-damascene structure which includes a metal hard mask that is disposed on a first material layer with a damascene opening therein and a second material layer that fills the damascene opening and covers the metal hard mask, comprising:
   conducting a first chemical mechanical polishing (CMP) step using a first slurry to remove the second material layer outside the damascene opening; and
   conducting a second CMP step using a second slurry to remove the metal hard mask, wherein a composition of the second slurry is different from a composition of the first slurry,
   wherein the second material layer comprises a metal layer, and the second slurry comprises $SiO_2$, $H_2O_2$, a metal corrosion inhibitor and water and has a pH value of 9-13.

2. The planarization process of claim 1, wherein the first material layer comprises a dielectric layer.

3. The planarization process of claim 2, wherein the damascene opening comprises a dual damascene opening.

4. The planarization process of claim 2, wherein
   the pre-damascene structure further comprises a barrier layer in the damascene opening and on the metal hard mask; and
   the second CMP step removes the barrier layer on the metal hard mask before removing the metal hard mask.

5. The planarization process of claim 4, wherein selectivity of the first slurry to the metal layer relative to the barrier layer ranges from 50:1 to 500:1.

6. The planarization process of claim 5, wherein the metal layer comprises copper, and the first slurry comprises $SiO_2$ or $Al_2O_3$, $H_2O_2$ and water and has a pH value of 1-6.

7. The planarization process of claim 4, wherein the second CMP step further removes a portion of the dielectric layer after removing the metal hard mask.

8. The planarization process of claim 4, wherein
   selectivity of the second slung to the barrier layer relative to the metal layer ranges from 1:1 to 5:1;
   selectivity of the second slurry to the barrier layer relative to the metal hard mask ranges from 1:5 to 5:1; and
   selectivity of the second slurry to the barrier layer relative to the dielectric layer ranges from 0.5:1 to 50:1.

9. The planarization process of claim 8, wherein the metal layer comprises copper.

10. The planarization process of claim 1, wherein the metal corrosion inhibitor comprises benzotriazole (BTA).

* * * * *